(12) United States Patent
Colbeth et al.

(10) Patent No.: US 6,921,892 B2
(45) Date of Patent: Jul. 26, 2005

(54) ELECTROSTATIC IMAGER

(75) Inventors: Richard Colbeth, Los Altos, CA (US); George Zentai, Mountain View, CA (US); Shuji Yamaoka, Hiroshima (JP)

(73) Assignee: Varian Medical Systems, Inc., Palo Alto, CA (US)

(*) Notice: Subject to any disclaimer, the term of this patent is extended or adjusted under 35 U.S.C. 154(b) by 381 days.

(21) Appl. No.: 10/325,809

(22) Filed: Dec. 18, 2002

(65) Prior Publication Data

US 2004/0118991 A1 Jun. 24, 2004

(51) Int. Cl.$^7$ .......................... G02F 1/13; G02F 1/1333
(52) U.S. Cl. ...................... 250/214.1; 349/199; 359/54
(58) Field of Search .......................... 250/208.1, 214.1; 349/199; 359/54, 105

(56) References Cited

U.S. PATENT DOCUMENTS

| | | | |
|---|---|---|---|
| 5,325,442 A | | 6/1994 | Knapp |
| 5,550,659 A | * | 8/1996 | Fujieda et al. ................. 349/12 |
| 6,483,931 B2 | | 11/2002 | Kalnitsky et al. |
| 6,614,053 B1 | * | 9/2003 | Takenaka ..................... 257/66 |
| 2001/0050728 A1 | | 12/2001 | Edwards |
| 2002/0131011 A1 | * | 9/2002 | Izumi ......................... 349/199 |

* cited by examiner

*Primary Examiner*—Stephone B. Allen
(74) *Attorney, Agent, or Firm*—Blakely, Sokoloff, Taylor & Zafman LLP

(57) ABSTRACT

An apparatus and method for detecting an electrostatic charge on a flat panel imager pixel array. In one embodiment, the apparatus includes an insulator layer and a flat panel pixel array coupled to a bottom surface of the insulator layer. Each pixel of the pixel array has a storage capacitance, and an electrostatic charge corresponding to a voltage applied through an electrode coupled to a top surface of the insulating layer may be detected from each storage capacitance.

62 Claims, 13 Drawing Sheets

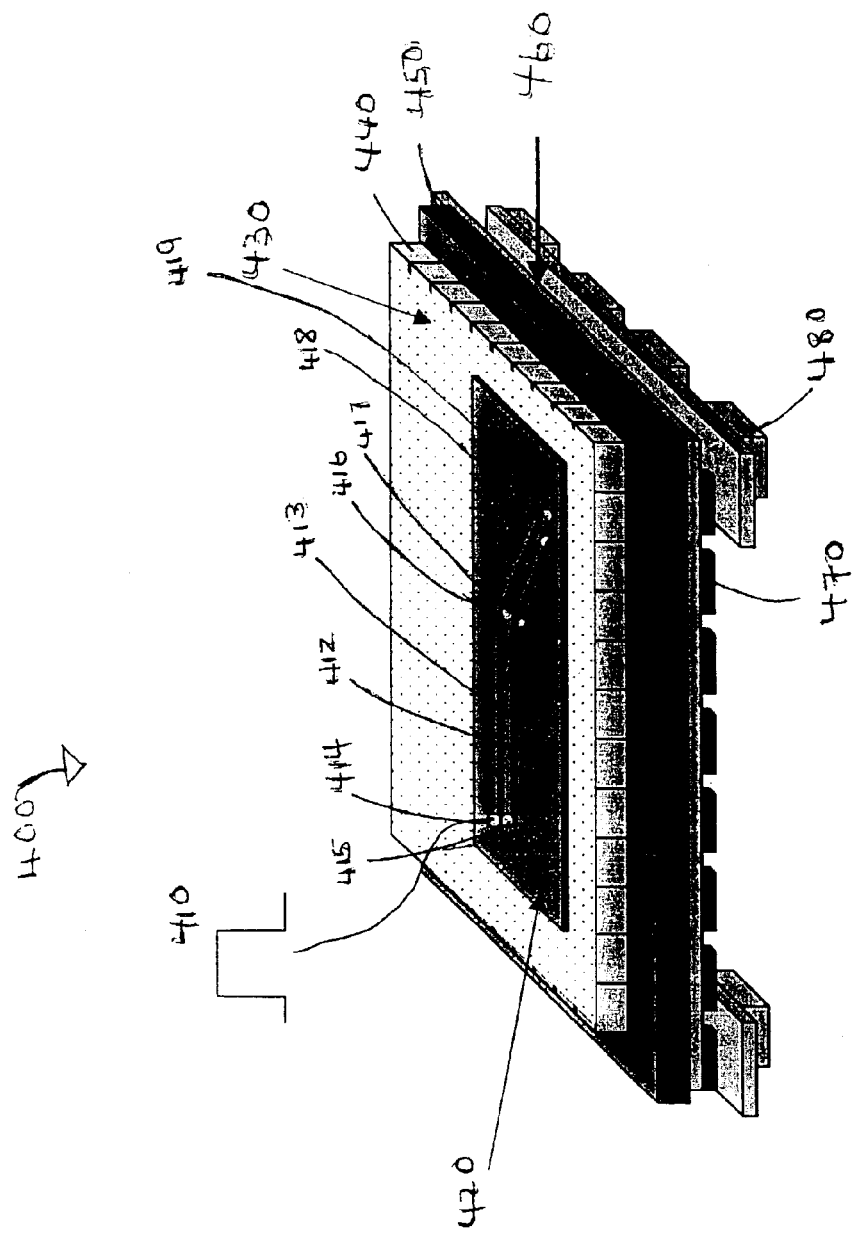

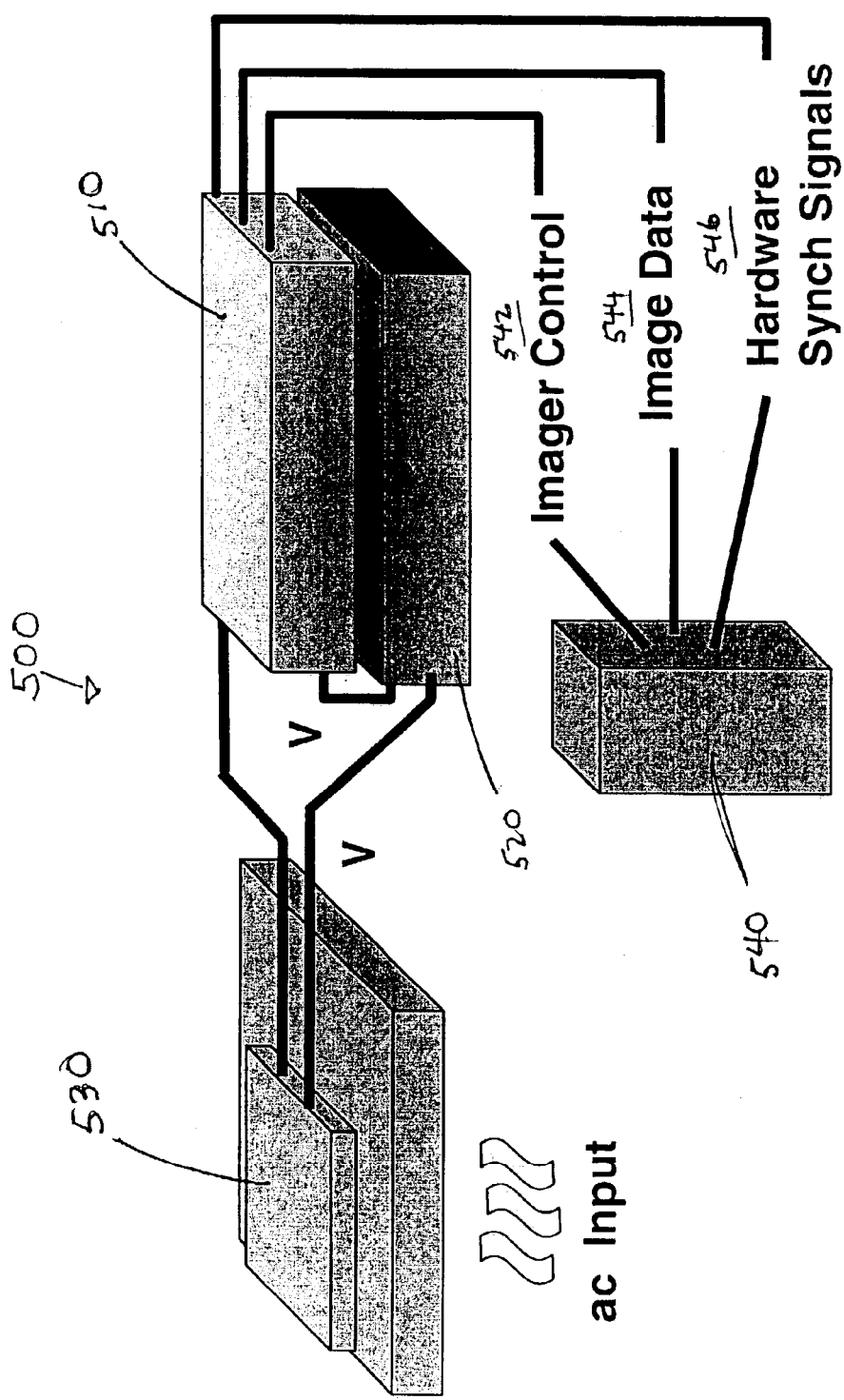

ELECTROSTATIC IMAGER

TECHNICAL FIELD

Embodiments of the invention relate to the field of imagers and, in particular, to electrostatic imagers.

BACKGROUND

A printed circuit board ("PCB") is a thin plate on which integrated circuits and other electronic components (e.g., discrete) are mounted. For example, computers typically include one or more PCBs such as motherboards, controller cards, and network interface cards ("NIC"). Once a PCB has been manufactured, it undergoes testing, including a continuity test to ensure that no opens or shorts exist on the conductive trace routes. PCBs can be quite large, containing intricate patterns of hundreds of traces. Many high density printed circuit products have been developed for High Density Interconnects ("HDI") applications. Examples of HDI applications include integrated circuit packaging, hard disk drives, mobile phones, and flat panel displays. These applications require high density circuits having fine lines smaller than 50-micron lines and spaces, and tight contact pads which have a smaller pitch than 100 microns. However, the production of high density circuits and other PCBs are not reliable, requiring electrical continuity tests be performed on various trace routes of the circuit board.

One method for testing the continuity of a trace routes on circuit boards includes optically inspecting each trace for opens or shorts, for example, automatic optical inspection ("AOI"). However optical methods have not proved as reliable as physically testing the electrical connection of each circuit. Another method includes electrically testing the continuity of each trace. Electrical open/short tests, which provide more reliable results than optical testing, have limitations of their own. Current electrical test equipment uses contact pin probes, but these probes have physical limitations in the pitch size of the probes. Typically, 0.3 mm pitch probes may be the limits on a single pad line and 0.2 mm pitch probe arrays on dual line pads. In addition, the contact pin probes may cause mechanical damage and stains to the circuit during testing. High pressure may be required to make exact electrical contact on each pad of high density circuits. As such, the probes may cause dents on a small pad which requires a uniform surface to make a reliable connection which is fragile against mechanical force, especially for flying leads of flex circuits.

Charge coupled device ("CCD") imagers have been used for testing the continuity of traces on a PCB. These imagers allow for trace routes to be visually inspected. However, CCD imagers are severely restricted in their size (because of the limitations of producing large scale wafers) thereby making them impractical for testing of large size PCBs.

SUMMARY

An apparatus and method for detecting an electrostatic charge on a flat panel imaging pixel array is described. In one embodiment, the apparatus includes an insulator layer and an a-Si pixel array coupled to a bottom surface of the insulator layer. Each pixel of the pixel array has a storage capacitance, and an electrostatic charge corresponding to a voltage applied through an electrode coupled to a top surface of the insulating layer may be detected from each storage capacitance. One exemplary method includes capacitively coupling a conductive trace to an a-Si electrostatic detector having a pixel array. A voltage applied to the conductive trace coupled to the a-Si electrostatic detector can be measured to generate a signal.

Additional features and advantages of the apparatus will be apparent from the accompanying drawings and detailed description that follow below.

BRIEF DESCRIPTION OF THE DRAWINGS

Embodiments of the present invention are illustrated by way of example, and not limitation, in the figures of the accompanying drawings in which:

FIG. 4B illustrates another exemplary embodiment of an electrostatic imager coupled to a circuit board showing a trace route.

FIG. 5 illustrates a block diagram of an exemplary embodiment of a capacitance imager system.

DETAILED DESCRIPTION

Figure 1:
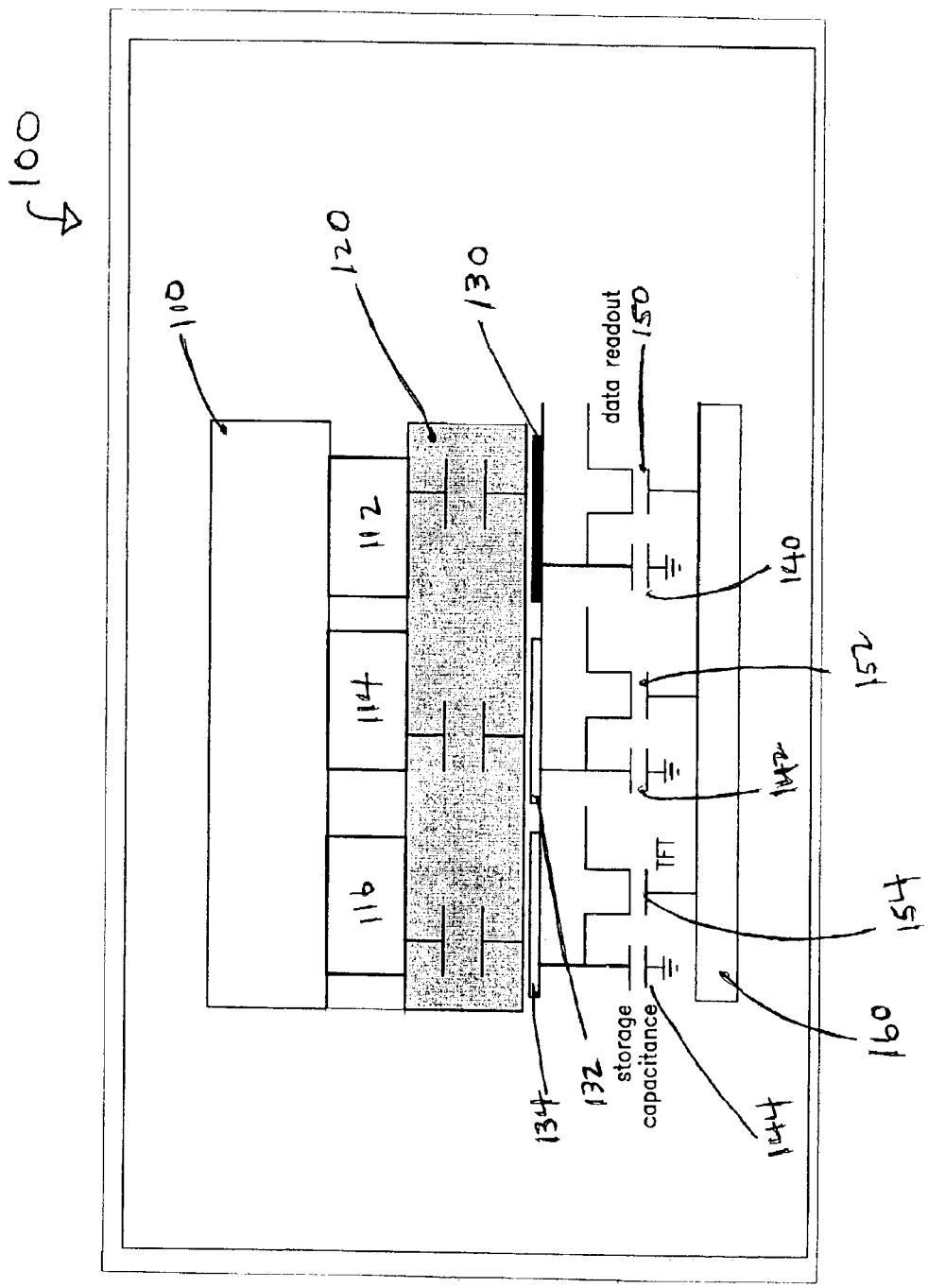
FIG. 1 illustrates a cross-section of an exemplary embodiment of conductive traces capacitively coupled to a pixel array.

In the following description, numerous specific details are set forth such as examples of specific, components, processes, etc. in order to provide a thorough understanding of various embodiments of the present invention. It will be apparent, however, to one skilled in the art that these specific details need not be employed to practice various embodiments of the present invention. In other instances, well known components or methods have not been described in detail in order to avoid unnecessarily obscuring various embodiments of the present invention.

The steps discussed herein may be performed by hardware components or may be embodied in machine-executable instructions, which may be used to cause a general-purpose or special-purpose processor programmed with the instructions to perform the steps. Alternatively, the steps may be performed by a combination of hardware and software.

In one embodiment a computer program product, or software, may include a machine-readable medium having stored thereon instructions, which may be used to program a computer system (or other electronic devices) to perform a process according to the present disclosure. A machine-readable medium includes any mechanism for storing or transmitting information in a form (e.g., software, processing application) readable by a machine (e.g., a computer). The machine-readable medium may includes, but is not limited to, magnetic storage medium (e.g., floppy diskette); optical storage medium (e.g., CD-ROM); magneto-optical storage medium; read only memory (ROM); random access memory (RAM); erasable programmable memory (e.g., EPROM and EEPROM); flash memory; electrical, optical, acoustical or other form of propagated signal (e.g., carrier waves, infrared signals, digital signals, etc.); or other type of medium suitable for storing electronic instructions.

Methods discussed herein may also be practiced in distributed computing environments where the machine-readable medium is stored on and/or executed by more than one computer system. In addition, the information transferred between computer systems may either be pulled or pushed across the communication medium connecting the computer systems.

A system and method for testing conductive traces on a circuit board are described. The testing of conductive traces on a circuit board may include testing for electrical continuity, opens, and shorts on particular trace routes. In one embodiment, a flat panel imaging electrostatic detector may be used. For example, an amorphous silicon ("a-Si") based electrostatic imager may be capacitively coupled to a PCB. In one embodiment, the a-Si based electrostatic imager may be a thin film transistor ("TFT") flat panel imager having pixels with storage capacitors. In an alternative embodiment, the detector may have pixels with single and/or double switching diodes. The capacitive charge detected by the electrostatic imager when a voltage is applied to a trace route enables the trace route generated as an image. In one embodiment, the trace route may be compared with a known, expected trace route.

The descriptions for the figures referenced below may be discussed with respect to a-Si based, flat panel electrostatic imagers. It may be appreciated by one of skill in the art however, that other types of flat panel electrostatic imagers may be used, including but not limited to polycrystalline silicon ("p-Si") and organic semiconductor electrostatic imagers.

FIG. 1 illustrates a cross-sectional view of one embodiment of an electrostatic imager 100. Circuit board 110 (e.g., a PCB) is capacitively coupled to pixels 130, 132, 134. In one embodiment, a pixel array having pixels 130, 132, 134 may be part of an electrostatic imager (e.g., an a-Si TFT imager) having storage capacitance 140, 142, 144 and readout transistors 150, 152, 154. An electrostatic imager of this type may also be referred to as a TFT flat panel detector ("FPD"). In an alternative embodiment, the pixel array may have pixels 130, 132, 134 with single and/or double switching diodes (e.g., as in Trixell panels). Circuit board 110 includes conductive traces 112, 114, 116 coupled to insulator 120 (e.g., an electrical insulator) that separates conductive traces 112, 114, 116 from pixels 130, 132, 134. Conductive traces 112, 114, 116 may be any type of material capable of conducting electrical pulses. Substrate 160 supports TFT detector. In one embodiment, substrate 160 may be a glass or comparable material known in the art such as ceramic and flexible materials (i.e. Kapton®, Mylar® made by Dupont of Wilmington, Del., and other plastic based materials, etc.).

By capacitively coupling the traces 112, 114, 116 of circuit board 110 with pixels 130, 132, 134 of an electro-static detector illustrated in FIG. 1, a particular trace route may be detected by measuring the charge on a pixel of the detector. In the configuration illustrated in FIG. 1, conductive trace 112 is capacitively coupled to pixel 130. By applying a voltage to conductive trace 112, an electrical charge develops between conductive trace 112 and pixel 130 (i.e., conductive trace and pixel serve as the opposing electrodes of a capacitor formed with insulator). The charge on storage capacitance 140 may be read out with transistor 150 that leads to data line and readout circuits. Pixel 130 of the pixel array is shown colored relative to pixels 132 and 134 to suggest that pixel 130 has been charged by an applied voltage through conductive trace 112.

In order to test a continuity of a conductive trace, the trace (e.g., trace 112 of circuit board 110) may be pressed against insulator 120 on one side, with the other side of insulator 120 in contact with a pixel array of an electrostatic detector. In order to form a capacitive effect between conductive trace 112 and pixel 130, insulator 120 is disposed between conductive trace 112 and pixel 130. Insulator 120 may be any number of materials known in the art to electrically separate conductive trace 112 from pixel 130. In one embodiment, insulator 120 may be a polyimide film such as Kapton®. Alternatively, insulator may be Mylar®. Under some circumstances and depending on the environmental conditions, pixels 130, 132, 134 may be exposed to light that may interfere with the insulating properties of thin film transistors 150, 152, 154 when they are in OFF state. As such, in one embodiment, a light blocking insulator layer (not shown) may be disposed on substrate 160.

In another embodiment, insulator 120 may include several layers of varying material. In one exemplary embodiment, a bottom layer may be Kapton® with a top layer of Mylar®. The Mylar® layer could be replaced over time if damaged from repeated contact with different circuit boards. Bottom layer can also have a permanent layer of black matrix. In addition to providing a separation between conductive trace 112 and pixel 130, insulator 120 provides a mechanical, protective layer for conductive traces 112, 114, 116 and pixels 130, 132, 134. Because conductive traces 112, 114, 116 (alone or as part of a PCB) are physically pressed against insulator 120, a thick insulator may prevent damage to conductive traces 112, 114, 116 and pixels 130, 132, 134. However, a balance between providing adequate protection to conductive traces 112, 114, 116 and the sensitivity level of pixels 130, 132, 134 should be taken into consideration because the thicker the insulator, the smaller the value of the coupling capacitance through the insulator layer resulting in a smaller charge detected in comparison to the noise signal (S/N ratio decreases).

Figure 2:
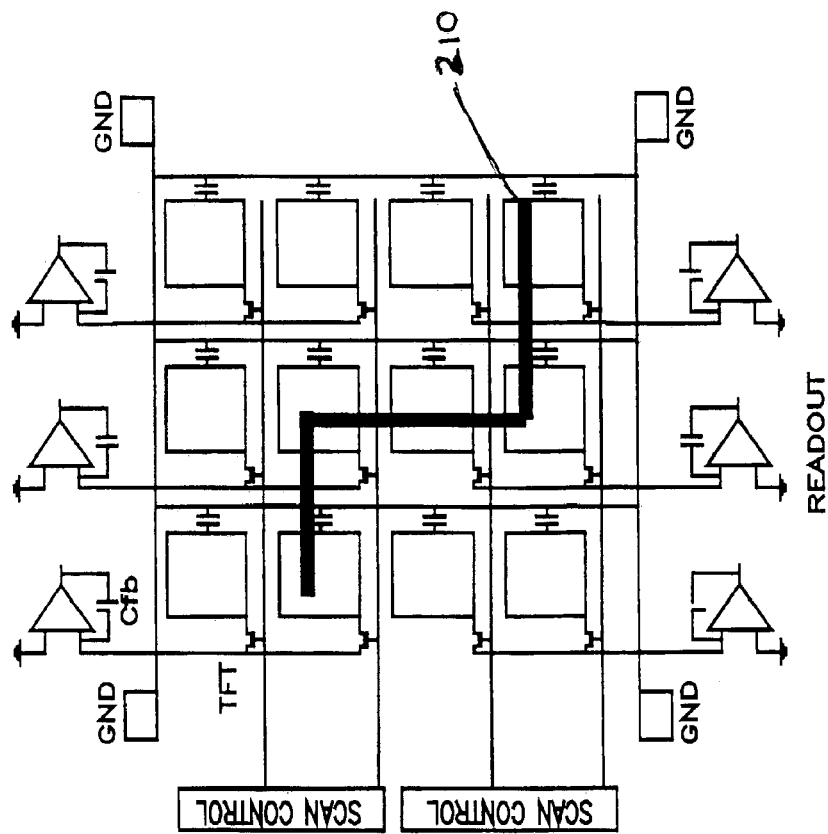
FIG. 2 illustrates an exemplary embodiment of a trace route coupled to a pixel array of an electrostatic detector.

FIG. 2 illustrates an exemplary embodiment of pixel array 200 corresponding to trace route 210. The particular path of trace route 210 activates the corresponding pixels that are disposed directly underneath trace route 210 and therefore capacitively coupled to trace route 210. In one embodiment, the pixel array may be part of an a-Si TFT imager.

Figure 3:
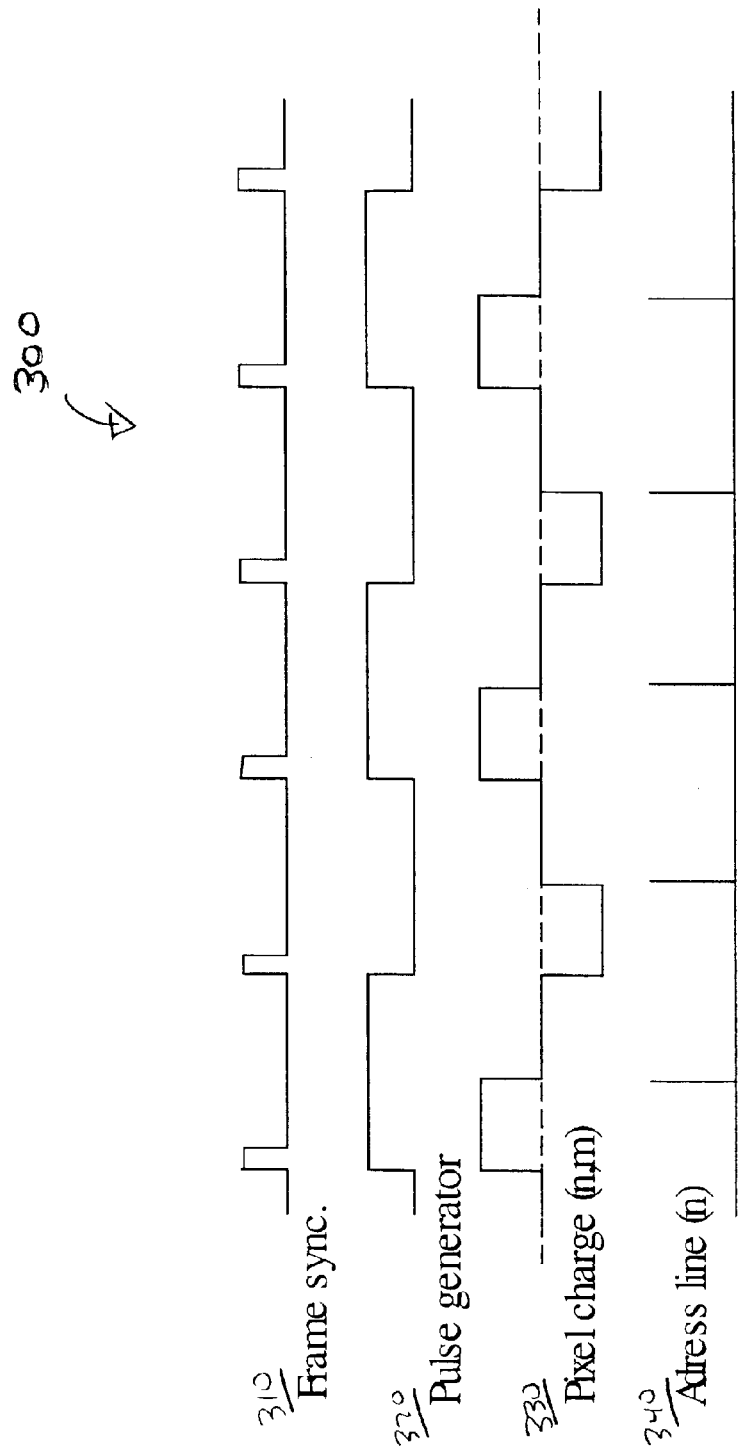
FIG. 3 illustrates an exemplary embodiment of a timing method for applying an electrical pulse.

FIG. 3 illustrates an exemplary embodiment of a timing method 300 for applying an electrical pulse to a conductive trace on a circuit board. In one embodiment, a pulse generator 320 applies an electrical pulse to a conductive trace according to a synchronized frame rate 310. Timing method 300 may be understood, in one embodiment, with applying an electrical pulse to conductive trace 112 of FIG. 1. Consequently, pixel 132, disposed underneath of trace 112 becomes activated. Because conductive trace 112 is capacitively coupled to a pixel 132, a positive charge 330 accumulates below pixel 132. Each charge corresponding to pixel 132 may then be detected by addressing the given row line 340 (e.g., where n is one case) to discharge the accumulated charge, and thereby generating a signal from the pixel.

According to the synchronized frame rate 310 illustrated in FIG. 3, an alternating current (AC) voltage is applied to the conductive trace. Because an AC voltage is applied, the frame following the positive pulse is negative pulse resulting in a negative charge underneath the pixel, which can also be detected by discharging the negative charge. A complete cycle for pulse generator 320 constitutes a positive pulse and a negative pulse. By applying an AC pulse, the two frames of a cycle (positive and negative) may be added to double the signal (amplitude) for the pixel. Alternatively, the pixel array may be reset after each positive pulse, so that only a positive pulse would need to be applied to the conductive trace.

Figure 4A:
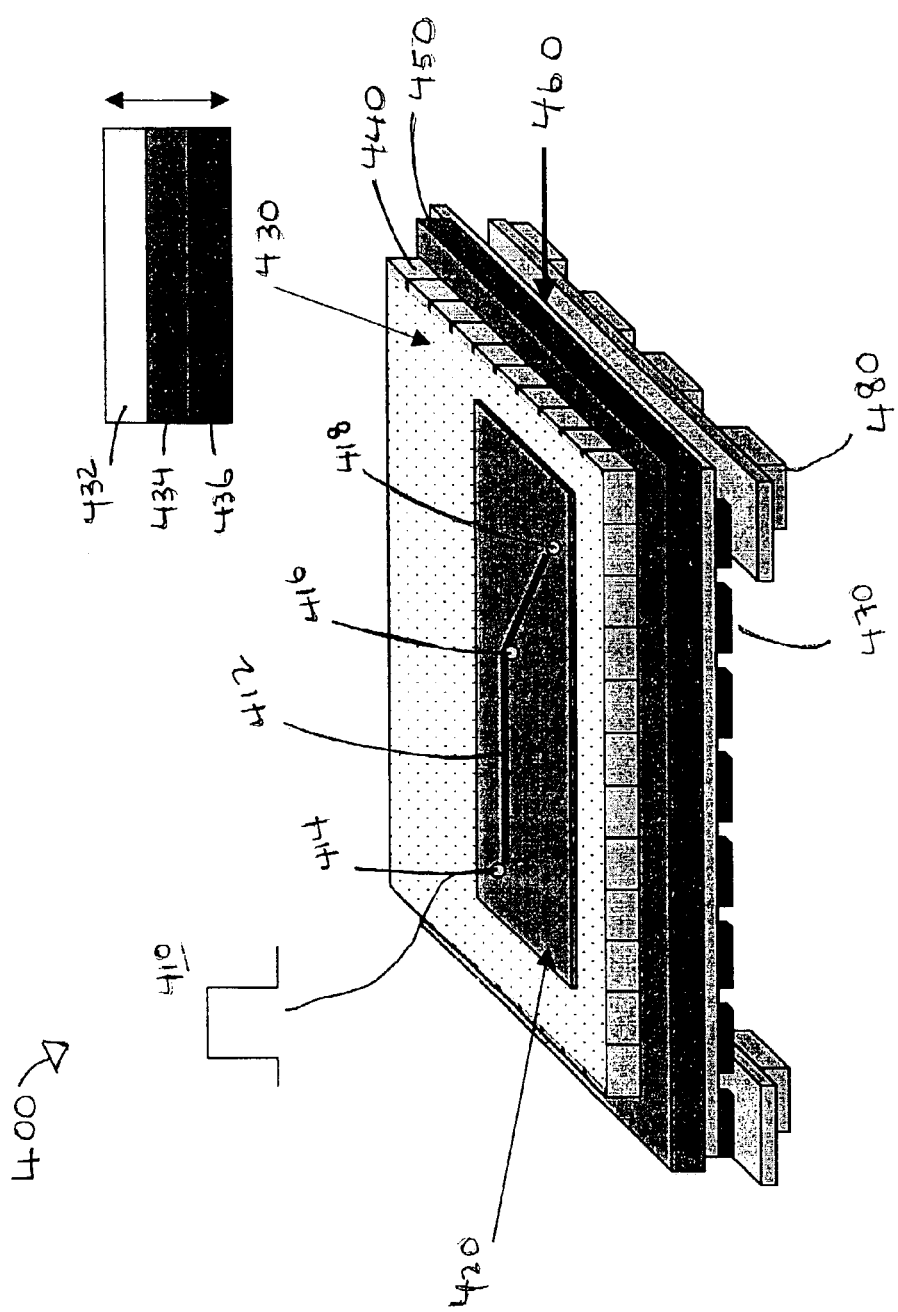
FIG. 4A illustrates an exemplary embodiment of an electrostatic imager coupled to a circuit board showing a trace route.
Figure 4C:
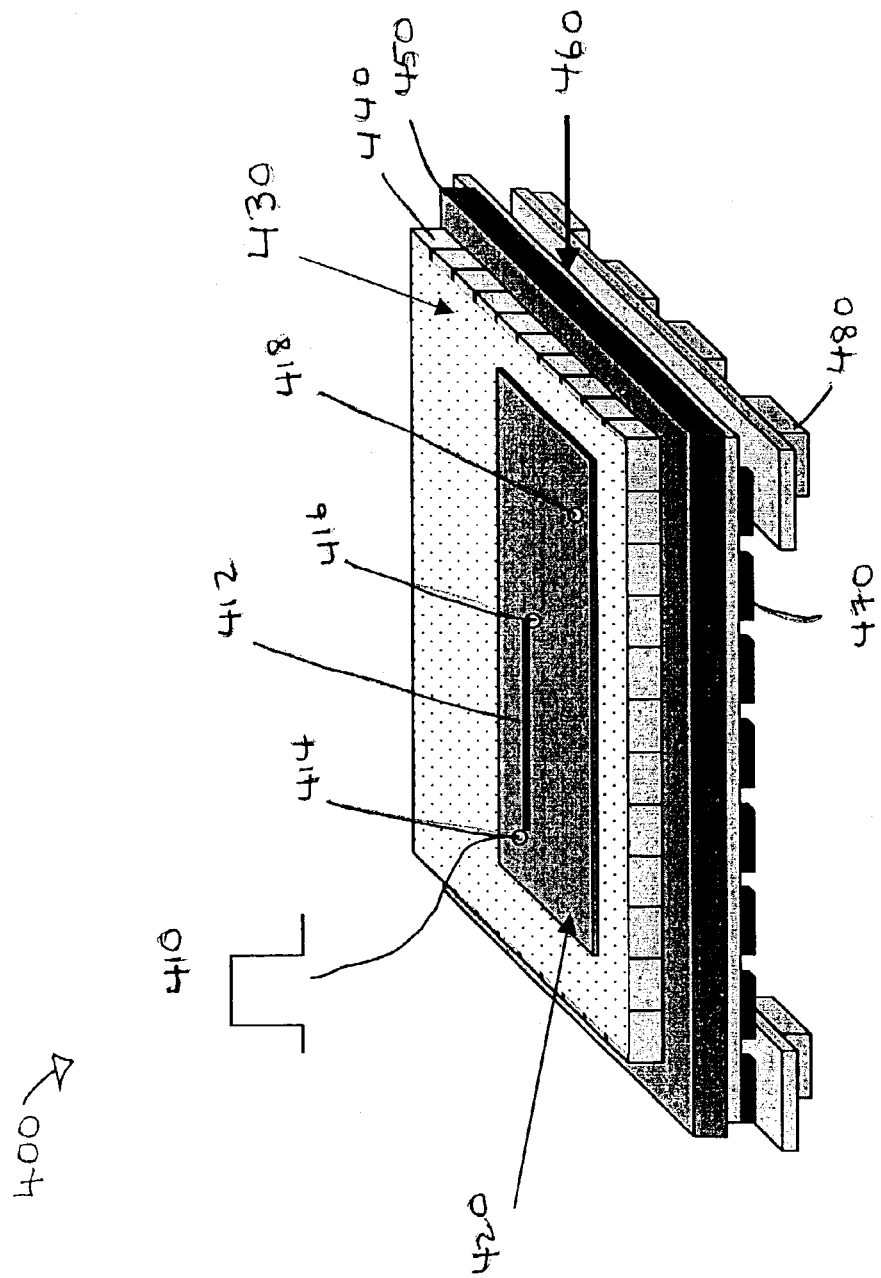
FIG. 4C illustrates another exemplary embodiment of an electrostatic imager coupled to a circuit board showing a trace route.

FIGS. 4A–4C illustrate exemplary embodiments of an electrostatic detector 400 coupled to a circuit board 420 having trace route 412 defined by points 414, 416, 418. Electrostatic detector 400 may be a multi-layer imager having insulator 430 for the top layer that makes direct contact with trace route 412 of circuit board 420. In one embodiment, insulator 430 may be Kapton® (as discussed above with respect to FIG. 1) or other comparable insulating materials known in the art. Pixel array 440 (viewed from the side) is disposed below insulator 430. In one embodiment, pixel array 440 may be an a-Si TFT array. Base plate 450 is disposed below pixel array 440 and analog to digital converting ("ADC") board 460 is disposed below base plate 450. In an alternative embodiment, ADC board 460 may not be required because the A/D conversion may be performed within readout chips (e.g., readout 150 of FIG. 1) so an external ADC may not be required. Alternatively, the signal may be transferred externally such that the A/D conversion is performed outside the imager. As discussed above with respect to FIG. 1, base plate 450 may be a glass material in one embodiment. Readout board 470 is disposed below base plate 450 and driver board 480 is disposed below readout board 470.

As illustrated in FIG. 4A, insulator 430 may include several layers 432, 434, 436 of varying insulating material. In one exemplary embodiment, top layer 432 may be Mylar®, middle layer 434 may be Kapton® and bottom layer 436 may be a black matrix.

Trace route 412 of circuit board 420 is shown along points 414, 416, 418. Trace route 412 is detected by pixel array 440 upon the application of pulse 410 to trace 412. As discussed above with respect to FIGS. 1 and 2, the application of pulse 410 generates a charge of the pixels along the path of trace route 412 because trace route 4712 is capacitively coupled to pixel array 440. ADC board 450 detects the charge accumulated on pixel array 440 and relays the signal to readout board 470 to communicate a charge signal associated with each pixel of pixel array 440.

FIG. 4B illustrates trace route 412 tested on circuit board 420 showing a short between neighboring traces routes 412 and 413. In this scenario, an electrical pulse 410 is applied only to trace route 412, but the pixel array 440 detects trace routes 412 and 413, suggesting that an electrical short exists between trace routes 412 and 413. The electrical short could exist between points 414 and 415, or between points 416 and 417, or between points 418 and 419. FIG. 4C illustrates trace route 412 with a break at point 416. When electrical pulse 410 is applied to trace route 412, instead of extending from point 414 to 416 and to 418, the trace ends at point 416. The examples illustrated in FIGS. 4A–4C do not encompass all the possible scenarios that may occur in the testing of a trace route and other trace patterns may be appreciated by one of skill in the art.

FIGS. 4A–4C may be used to show how a set of circuit boards may be tested. Trace route 412 of FIG. 4A may correspond to the proper trace route that exists on circuit board 420. In other words, trace route 412 of FIG. 4A would pass an open/short test. Circuit board 420 of FIG. 4A may then be used as the standard board to compare other boards having the same trace routes as circuit board 420. Compared against the trace route detected in FIG. 4A, the circuit boards of FIGS. 4B and 4C would result in board failure.

FIG. 5 illustrates a block diagram of a capacitance imager system 500 that includes the electrostatic charge detector described with respect to FIGS. 1 and 2. In this embodiment, electrostatic charge detector is referred to as receptor 530, which is coupled to processor 510, and power supply 520. Receptor 530 may be an a-Si TFT flat panel detector discussed above. Processor 510 includes the control system or the operating software the controls imager function and performs real-time, pixel-by-pixel calibration functions including offset and gain normalization (which will be discussed in greater detail below). Processor 510 also may serve as the interface to a workstation 540 that receives image data 544 from processor 510. Power supply 520, coupled to both processor 510 and receptor 530 provides the voltage to power processor 510 and receptor 530. In one embodiment, power supply 520 may provide 24 volts to receptor 530 and 5 volts to processor 510.

Receptor 530 and processor 510 may communicate with each other through different interfaces and cables such as a camera link, serial or parallel type communications, Ethernet, and via copper cable, through wireless link or optical fibers, flashcards and other forms of removable media. Data corresponding to a charge detected may be transmitted from receptor 530 across the optical fiber to processor 510. In one embodiment, processor 510 includes a software library of function calls that activate for example, windows dynamic link library ("DLL") that would call an image. Alternatively, workstation 540 may interact with processor 510 to receive image data from processor 510 for viewing on a display (explained in greater detail with respect to FIG. 7 below). Workstation 540 may also have imager control 542 capabilities for processor 510 as well as hardware synch signals 546. In one embodiment, communication between processor 510 and workstation 540 may be accomplished via Ethernet.

Figure 6:
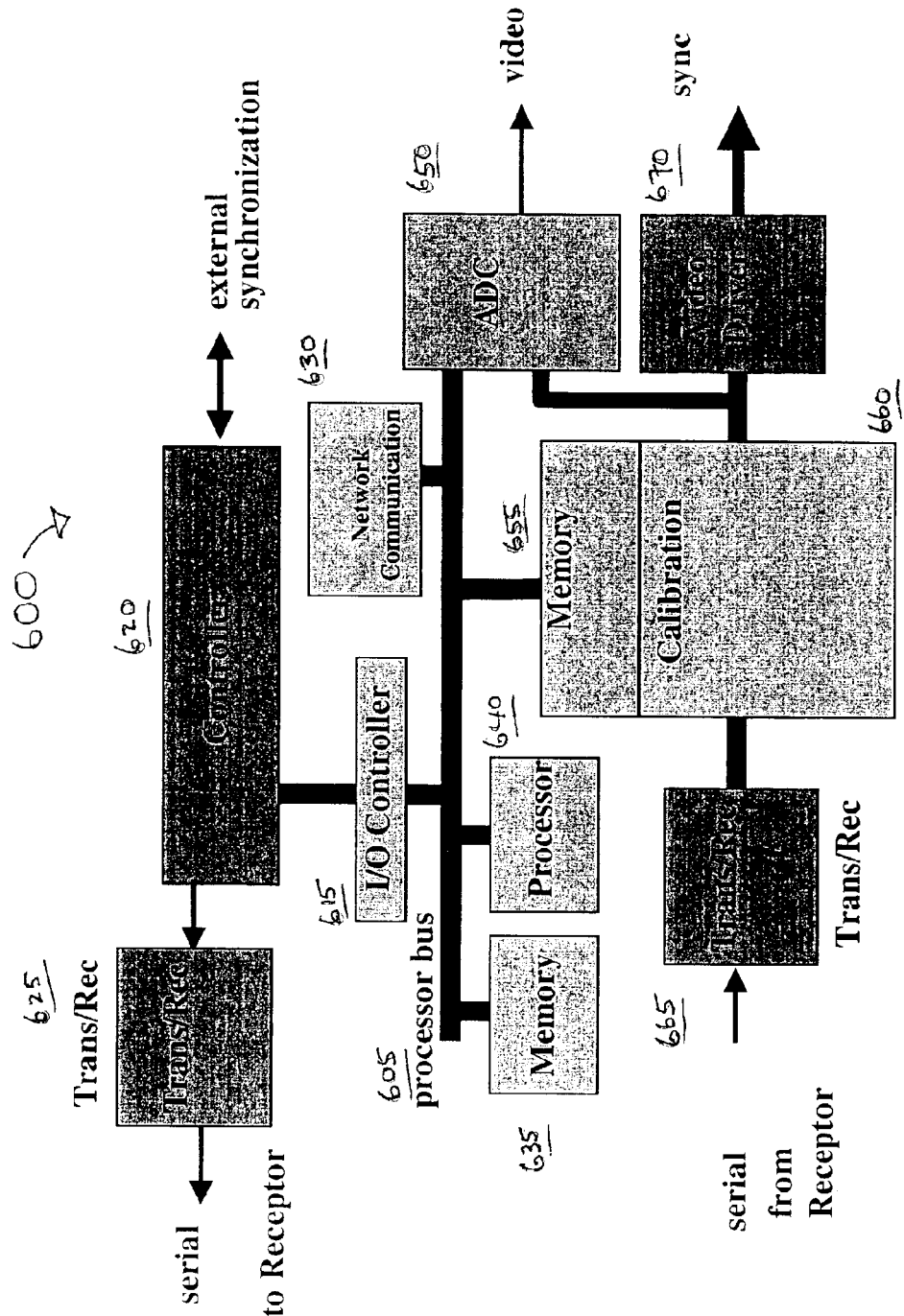
FIG. 6 illustrates a block diagram of one embodiment of a processor architecture.

FIG. 6 illustrates a block diagram of one embodiment of a processor architecture 600 that may be used as part of the charge detection system (i.e. receptor) described with respect to FIG. 5. Processor includes processing means such as processor 640 coupled with a system bus 605 for processing information. Processor 640 may represent one or more general purpose processors (e.g., Motorola Power PC processor or an Intel Pentium processor) or special purpose processor such as a digital signal processor ("DSP") (e.g., a Texas Instrument DSP). Processor 640 may be configured to execute the instructions for performing the operations and steps discussed herein. For example, processor 640 may be configured to process algorithms to generate an image of a trace route on a display. Processor 640 may also be coupled to memory 635, which, for example, may store the operating instructions for processor 640.

Processor 600 includes transmitter/receiver 665 to receive data from receptor (e.g., electrostatic detector). Processor 600 further includes memory 655 that may include a random access memory ("RAM") or synchronous dynamic random access memory ("SDRAM"), or other dynamic storage devices for storing calibration instructions 660 to be executed by processor 640. Calibration instructions 660 may include variables or other intermediate information for calculating gain, offset and defective pixel corrections based on the data received from the receptor. Processor 600 may also include an input/output ("I/O") controller 615 to control operations between processor 640 and controller 620. Controller 620 may control functions of the receptor through transmitter/receiver 625.

Processor 600 also includes network communication device 630 for accessing other computer systems of a distributed system via a network. The network communication device 630 may include any of a number of commercially available networking peripheral devices such as those used for coupling to an Ethernet, token ring, Internet, or wide area network. Network communication device 630 may further be a null-modem connection, or any other mechanism that provides connectivity between processor and the outside world. Processor 600 also may include ADC 650 to generate an analog video signal and/or video drive 670 to generate a digital video signal.

It should be noted that the architecture illustrated in FIG. 6 is only exemplary. In alternative embodiments, other architectures may be used for processor 600. For example, various components may be coupled together (e.g., directly to one another) and with other types of buses.

Figure 7:
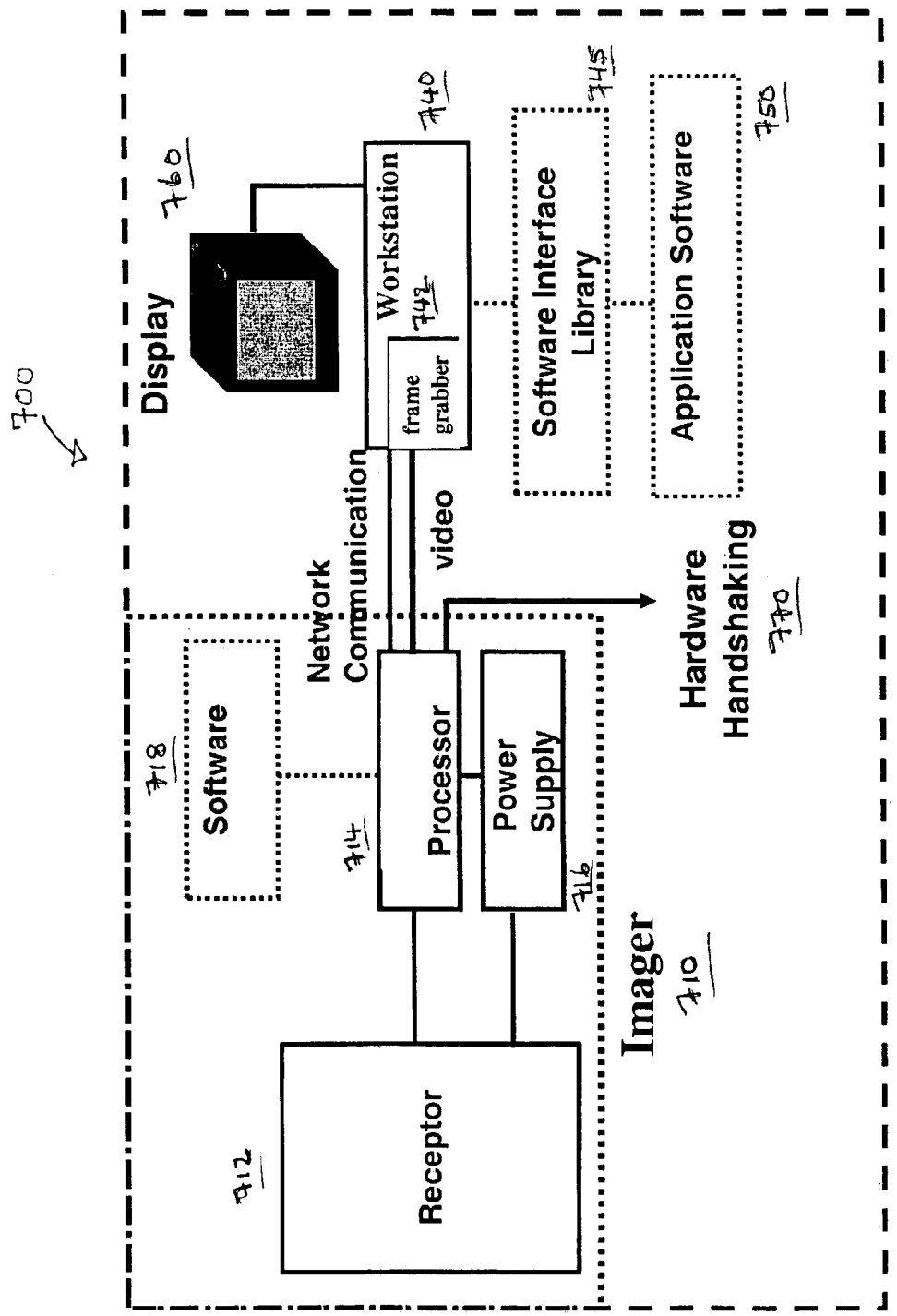
FIG. 7 illustrates a block diagram of another exemplary embodiment of an electrostatic imager system.

FIG. 7 illustrates one embodiment of an electrostatic imager system 700 in which the main parts include capacitance imager 710, computer system 740 and display 760. In one embodiment, electrostatic imager system 700 may be used to test the continuity of a trace routes on a printed circuit. Capacitance imager 710 includes receptor 712, processor 714, and power supply 716. Receptor 712 may be an a-Si based TFT flat panel detector. Processor 714 includes the control system or the operating software 718 that controls imager function and performs real-time, pixel-by-pixel calibration functions including offset and gain normalization (discussed in greater detail below).

Processor 714 also may communicate data with a workstation 740 (e.g., a computer) to transmit data from receptor 712 including video data to view an image of a trace route on display 760. Workstation 740 may also include frame grabber module 742 so that data corresponding to signals generated from each electric pulse may be interpreted. As such images generated by processor 714 may be communicated to workstation 740. In one embodiment, a 16-bit video port connection from processor to workstation 740 provides real time images to be captured by frame grabber 742 and viewed with display 760. Processor 714 may also include hardware handshaking port 770 for synchronizing the hardware of processor 714 with workstation 740.

Workstation 740 may also utilize software interface library 745 and software 750 to process video data communicated from processor 714. Processor may communicate with workstation 740 through a network (e.g., an Ethernet or wireless connection). Power supply, coupled to provides the AC input to receptor and processor. Processor is linked to system controller via an Ethernet connection. Alternatively processor may be linked to system controller via wireless communication (e.g., infrared).

Figure 8:
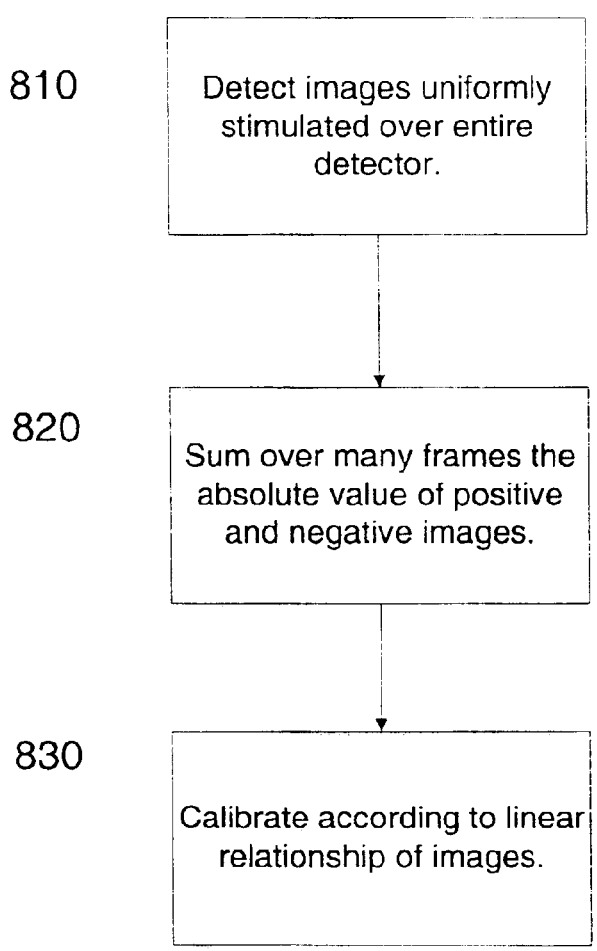
FIG. 8 illustrates an exemplary embodiment of a method for calibrating a gain for an electrostatic imager.

As described above with respect to FIG. 3, a complete frame cycle includes a positive and negative pulse applied to each pixel on a detector. Each pixel may be calibrated to correct for charge contribution (e.g., offset/background variation, gain variation and lag current). FIG. 8 illustrates one embodiment of a method 800 for calibrating a gain variation for a pixel on an electrostatic detector. An electrostatic detector may not have a pixel array with uniform sensitivity over the entire array, For example the edges of the pixel array may be less sensitive than the central region of the array. To account for differences in the sensitivity of each pixel, the pixel array may be calibrated with a value. At block 810, a series of images may be applied over the electrostatic detector that uniformly stimulates each pixel. At block 820, the sum of the images applied is calculated, and in the case of positive and negative image frames applied, the absolute value of the frames may be added. At block 830, each pixel may then be calibrated for by adjusting for a gain value based on a linear relationship of the images applied over the detector. By assuming that a linear pattern exists, and by knowing where one point on the linear curve is, then the signal for other points on the curve may be determined. So for every pixel, the calibration allows for a two-point correction.

Figure 9:
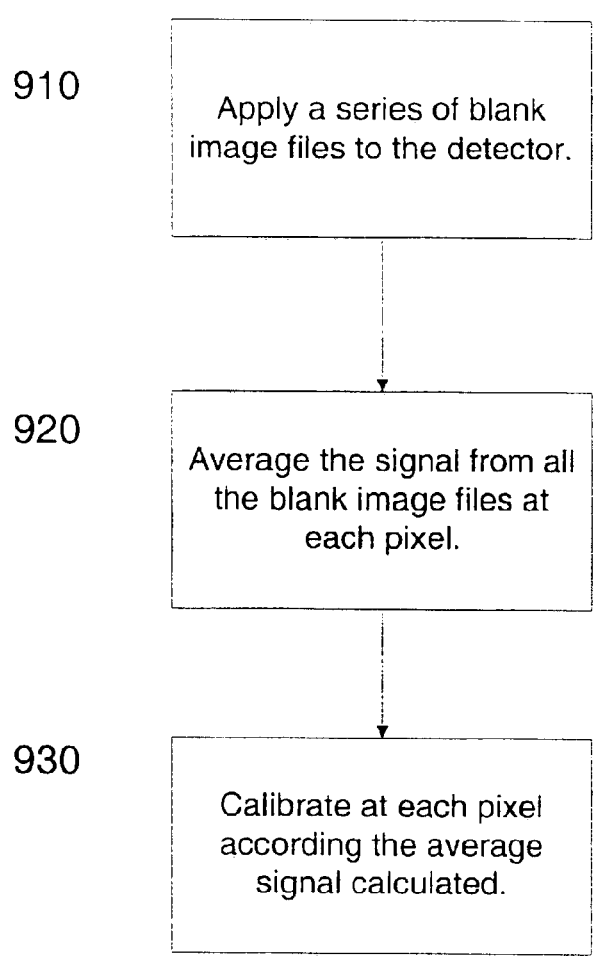
FIG. 9 illustrates an exemplary embodiment of a method for calibrating an offset for an electrostatic imager.

FIG. 9 illustrates one embodiment of a method 900 for calibrating an offset/background value for a charge measured on a pixel from an electrostatic detector. In some case, the storage capacitance corresponding to a particular pixel electrode (e.g., illustrated in FIG. 1) may not completely discharge between electrical pulses. As a result, each pixel electrode may have a background or offset value associated with it. Temperature sensitivity may also cause background signals to exists. To correct for background signals at each pixel electrode, at block 910, a series of image files (e.g., 100 files) that generate no signal are applied to the detector. At block 920, the signals from all the blank image files are then averaged. At block 930, each pixel is calibrated according to the average signal calculated from the blank image files. Because the electrostatic detectors may be temperature sensitive, the background calibration may be done as often as possible, typically between electric pulses. The processor (e.g., processor 600 illustrated in FIG. 6) may be configured to support automatic offset calibration.

Figure 10:
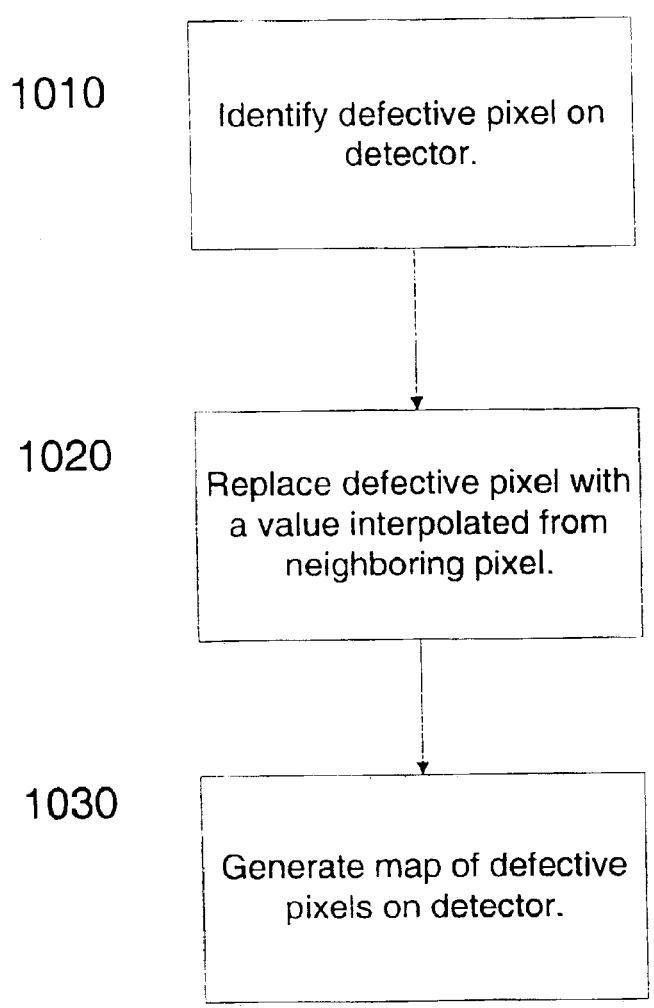
FIG. 10 illustrates an exemplary embodiment of a method for correcting an electrostatic imager defect.

FIG. 10 illustrates one embodiment of a method 1000 for correcting pixel defects on an electrostatic detector. At block 1010, defective pixels are identified on the detector. Defective pixels may be identified by setting a minimum and maximum value range that can be measured for each pixel. Values generated outside of this range would suggest a defective pixel for which a correction may be applied. At block 1020, the value corresponding to a defective pixel is replaced with a value interpolated from a neighboring pixel. At block 1030, a map of defective pixels on the detector may be generated and referenced for future use. The pixel correction of method 1000 may be performed in real time.

Figure 11:
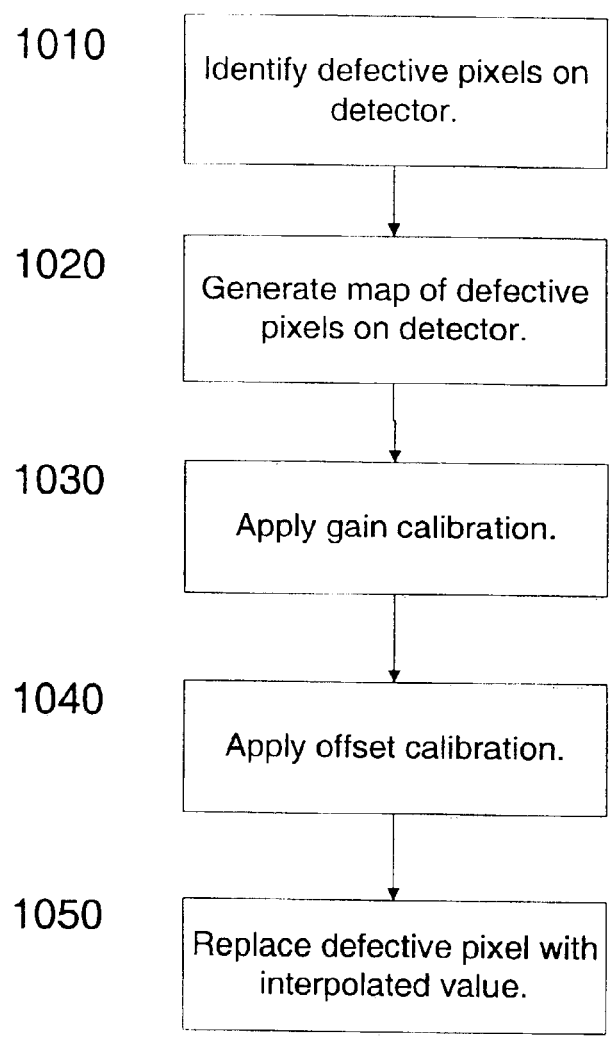
FIG. 11 illustrates an exemplary embodiment of a method for a calibration sequence.

FIG. 11 illustrates an exemplary embodiment of a method 1100 for calibrating a value generated from an electrostatic detector. At block 1010, defective pixels on the detector are identified. At block 1020, a map may be generated identifying the defective pixels. The map may be used for future reference in processing a signal corresponding to a charge detected at a pixel. At block 1030, a gain calibration is applied to the signal. In one embodiment, the gain calibration is applied according to the method described with respect to FIG. 8. At block 1040, an offset calibration is applied to the signal. In one embodiment, the offset calibration is applied according to the method described with respect to FIG. 9. At block 1050, any defective pixel is corrected by replacing the original signal value with an adjusted value according to a correction algorithm. In one embodiment, defective pixels may be corrected using the method described with respect to FIG. 10.

It may be appreciated by those of ordinary skill in the art that the methods described above with respect to FIGS. 8–11 may be implemented with a control logic or software stored on any machine-readable medium locally or remotely accessible. A machine-readable medium includes any mechanism for storing or transmitting information in a form readable by a machine (e.g. a computer). For example, a machine readable medium includes read-only memory (ROM), random access memory (RAM), magnetic disk storage media, optical storage media, flash memory devices, electrical, optical, acoustical or other forms of propagated signals (e.g. carrier waves, infrared signals, digital signals, etc.).

A novel method for testing the continuity of printed circuits have been presented. The method involves capacitively coupling conductive traces to an electrostatic detector (e.g., an a-Si TFT imager) having a pixel array, applying a voltage to the conductive trace, and measuring a storage capacitance on each pixel of the pixel array.

In the foregoing specification, the invention has been described with reference to specific exemplary embodiments thereof. It will, however, be evident that various modifications and changes may be made thereto without departing from the broader spirit and scope of the invention as set forth in the appended claims. The specification and figures are, accordingly, to be regarded in an illustrative rather than a restrictive sense.

What is claimed is:

1. An apparatus, comprising:
   an insulator layer having a bottom surface and a top surface; and
   a flat panel imaging pixel array coupled to the bottom surface of the insulator layer, wherein each pixel of the pixel array has a storage capacitance, and wherein an electrostatic charge corresponding to a voltage applied through a trace electrode coupled to the top surface of the insulating layer may be detected from each storage capacitance.

2. The apparatus of claim 1, wherein the flat panel imaging pixel array comprises an amorphous silicon ("a-Si") pixel array.

3. The apparatus of claim 2, wherein the a-Si pixel array is the basis for a thin film transistor ("TFT") flat panel detector.

4. The apparatus of claim 2, wherein the a-Si pixel array is the basis for a single switching diode flat panel detector.

5. The apparatus of claim 2, wherein the a-Si pixel array is the basis for a double switching diode flat panel detector.

6. The apparatus of claim 2, further comprising a readout transistor coupled to each storage capacitance, wherein the readout transistor transmits a signal corresponding to the electrostatic charge.

7. The apparatus of claim 6, further comprising a processor to receive the signal from each readout transistor corresponding to the electrostatic charge.

8. The apparatus of claim 7, further comprising a power source coupled to the flat panel imaging pixel array and the processor.

9. The apparatus of claim 8, further comprising a substrate layer disposed below and coupled to the flat panel imaging pixel array.

10. The apparatus of claim 9, further comprising an analog to digital converting ("ADC") board disposed below and coupled to the substrate layer.

11. The apparatus of claim 1, wherein the flat panel imaging pixel array comprises a polycrystalline silicon ("p-Si") pixel array.

12. The apparatus of claim 1, wherein the flat panel imaging pixel array comprises an organic semiconductor pixel array.

13. The apparatus of claim 9, wherein the substrate layer comprises an insulating material.

14. The apparatus of claim 13, wherein the substrate layer comprises glass.

15. The apparatus of claim 13, wherein the substrate layer comprises a ceramic material.

16. An apparatus, comprising:
    an insulator layer having a top surface and a bottom surface;
    a circuit board coupled to the top surface of the insulating layer; and
    an electrostatic detector having a flat panel imaging pixel array coupled to the bottom surface of the insulator layer, wherein each pixel of the pixel array has a storage capacitance, and wherein an electrostatic charge corresponding to a voltage applied through a conductive trace from the circuit board may be detected from each storage capacitance.

17. The apparatus of claim 16, wherein the flat panel imaging pixel array comprises an a-Si pixel array.

18. The apparatus of claim 17, wherein the a-Si pixel array is the basis for a TFT flat panel detector.

19. The apparatus of claim 17, wherein the a-Si pixel array is the basis for a single switching diode flat panel detector.

20. The apparatus of claim 17, wherein the a-Si pixel array is the basis for a double switching diode flat panel detector.

21. The apparatus of claim 17, further comprising a readout transistor coupled to each storage capacitance, wherein the readout transistor transmits a signal corresponding to the electrostatic charge.

22. The apparatus of claim 21, further comprising a processor to receive the signal from each readout transistor corresponding to the electrostatic charge.

23. The apparatus of claim 22, further comprising a power source coupled to the electrostatic detector and the processor.

24. The apparatus of claim 23, further comprising a substrate layer disposed below and coupled to the flat panel imaging pixel array.

25. The apparatus of claim 24, further comprising an analog to digital converting ("ADC") board disposed below and coupled to the substrate layer.

26. The apparatus of claim 16, wherein the flat panel imaging pixel array comprises a polycrystalline silicon ("p-Si") pixel array.

27. The apparatus of claim 16, wherein the flat panel imaging pixel array comprises an organic semiconductor pixel array.

28. The apparatus of claim 24, wherein the substrate layer comprises an insulating material.

29. The apparatus of claim 28, wherein the substrate layer comprises glass.

30. The apparatus of claim 28, wherein the substrate layer comprises a ceramic material.

31. A system, comprising:
    an electrostatic receptor having a flat panel imaging pixel array that detects a capacitive charge and transmits a signal corresponding to the capacitive charge;
    a power supply coupled to the electrostatic receptor; and
    a processor coupled to the receptor; wherein the processor generates an image data based on the signal received from the electrostatic receptor.

32. The system of claim 31, wherein the capacitive charge is generated from an electric pulse applied to a conductive trace coupled to the electrostatic receptor.

33. The system of claim 31, wherein the flat panel imaging pixel array comprises an a-Si pixel array.

34. The system of claim 33, wherein the electrostatic receptor further comprises:
a top insulator layer;
a TFT pixel array disposed below and coupled to the top insulator layer;
a substrate layer disposed below and coupled to the TFT pixel array.

35. The system of claim 34, further comprising a workstation coupled to the processor, wherein the workstation receives the image data from the processor.

36. A method, comprising:
capacitively coupling a conductive trace to an electrostatic detector having a flat panel imaging pixel array; and
producing an image of the conductive trace based on a measured capacitive charge at each pixel from the flat panel pixel array.

37. The method of claim 36, further comprising applying a voltage to the conductive trace.

38. The method of claim 37, further comprising measuring the capacitive charge based on the applied voltage.

39. The method of claim 36, further comprising identifying defective pixels on the electrostatic detector.

40. The method of claim 39, further comprising generating a map file of the defective pixels.

41. The method of claim 36, further comprising calibrating a gain value for the signal.

42. The method of claim 36, further comprising calibrating an offset value for the signal.

43. The method of claim 39, further comprising replacing the signal from a defective pixel with a corrected signal.

44. The method of claim 41, wherein calibrating the gain value comprises:
detecting a plurality of test images uniformly stimulated over the entire electrostatic detector; and
summing an absolute value of positive and negative images.

45. The method of claim 42, wherein calibrating the offset value comprises:
applying a plurality of blank images files to the electrostatic detector; and
averaging a signal from the plurality of blank image files at each pixel.

46. An apparatus, comprising:
means for capacitively coupling a conductive trace to an electrostatic detector having a flat panel imaging pixel array; and
means for producing an image of the conductive trace based on a measured capacitive charge at each pixel from the flat panel pixel array.

47. The apparatus of claim 46, further comprising means for applying a voltage to the conductive trace.

48. The apparatus of claim 47, further comprising means for measuring the capacitive charge based on the applied voltage.

49. The apparatus of claim 46, further comprising means for identifying defective pixels on the electrostatic detector.

50. The apparatus of claim 49, further comprising means for generating a map file of the defective pixels.

51. The apparatus of claim 46, further comprising means for calibrating a gain value for the signal.

52. The apparatus of claim 46, further comprising means for calibrating an offset value for the signal.

53. The apparatus of claim 49, further comprising means for replacing the signal from a defective pixel with a corrected signal.

54. The apparatus of claim 51, wherein means for calibrating the gain value comprises:
means for detecting a plurality of test images uniformly stimulated over the entire electrostatic detector; and
means for summing an absolute value of positive and negative images.

55. The apparatus of claim 52, wherein means for calibrating the offset value comprises:
means for applying a plurality of blank images files to the electrostatic detector; and
means for averaging a signal from the plurality of blank image files at each pixel.

56. A machine-readable medium having stored thereon instructions, which when executed by a processor, causes the processor to perform the following:
measuring a capacitive charge on an electrostatic detector, having flat panel imaging pixel array, based on an applied voltage;
generating a signal based on the capacitive charge measured at a pixel from a pixel array; and
producing an image of the conductive trace based on the signal.

57. The machine readable medium of claim 56, wherein the processor further performs identifying defective pixels on the electrostatic detector.

58. The machine readable medium of claim 57, wherein the processor further performs generating a map file of the defective pixels.

59. The machine readable medium of claim 58, wherein the processor further performs calibrating a gain value for the signal.

60. The machine readable medium of claim 59, wherein the processor further performs calibrating an offset value for the signal.

61. The machine readable medium of claim 60, wherein the processor further performs replacing the signal from a defective pixel with a corrected signal.

62. The apparatus of claim 1, wherein the trace electrode and each pixel pixel serve as opposing electrodes of a capacitor formed with the insulator.

* * * * *